(12) United States Patent
Ando

(10) Patent No.: US 6,399,991 B1
(45) Date of Patent: Jun. 4, 2002

(54) SEMICONDUCTOR INTEGRATED CIRCUIT

(75) Inventor: Yasuhiro Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 16 days.

(21) Appl. No.: 09/709,631

(22) Filed: Nov. 13, 2000

(30) Foreign Application Priority Data

Nov. 19, 1999 (JP) .......................................... 11-329190

(51) Int. Cl.$^7$ .............................................. H01L 23/62
(52) U.S. Cl. ........................ 257/355; 257/350; 257/360; 257/401
(58) Field of Search ................................. 257/355, 358, 257/360, 401, 313, 291; 357/41, 45

(56) References Cited

U.S. PATENT DOCUMENTS

| | | | | |
|---|---|---|---|---|
| 4,975,758 A | * | 12/1990 | Crafts .......................... | 357/45 |
| 5,309,012 A | * | 5/1994 | Jex et al. ..................... | 257/401 |
| 5,614,744 A | * | 3/1997 | Merrill ........................ | 257/291 |
| 5,637,900 A | * | 6/1997 | Ker et al. .................... | 257/355 |
| 5,714,784 A | * | 2/1998 | Ker et al. .................... | 257/360 |
| 5,838,050 A | * | 11/1998 | Ker et al. .................... | 257/401 |

FOREIGN PATENT DOCUMENTS

JP 62-73760 4/1987

\* cited by examiner

*Primary Examiner*—Richard Elms
*Assistant Examiner*—Douglas M Menz
(74) *Attorney, Agent, or Firm*—Young & Thompson

(57) ABSTRACT

In the guard ring section, four regions, p$^+$ diffusion region, n$^+$ diffusion region, n$^+$ diffusion region, and p$^+$ diffusion region, are formed to surround a hard macro and disposed in the order of this from the inside, and the inside two regions are disposed in an n well, and the outside two regions are disposed in a p well. A potential VSS is applied in the innermost p$^+$ diffusion region and the outermost p$^+$ diffusion region, and a potential VDD is applied in the two n$^+$ diffusion regions disposed between these p$^+$ diffusion regions. As a result, capacitors are formed between the n well and the p$^+$ diffusion region formed in the n well, and between the p well and the n$^+$ diffusion region formed in the p well, and therefore noise from outside is shielded, power source noise is absorbed, and malfunctions of the macro cell are prevented.

10 Claims, 6 Drawing Sheets

SEMICONDUCTOR INTEGRATED CIRCUIT

BACKGROUND OF THE INVENTION

1. Field of the Invention

The present invention relates to a semiconductor integrated circuit having a guard ring, and more particularly to a semiconductor integrated circuit having a macro cell such as a hard macro or a large driving buffer.

2. Description of the Related Art

A guard ring is known as technique of protecting a macro cell such as a hard macro or a large driving buffer from noise. The guard ring is a diffusion region formed so as to surround the macro cell, and this diffusion region absorbs noise so that the macro cell is shielded from the noise.

A conventional guard ring used in a large driving buffer is formed, in the case the large driving buffer is composed of NMOS transistor, by disposing a p$^+$ diffusion region so as to surround the large driving buffer on the outer circumference of the large driving buffer. At this time, the p$^+$ diffusion region is provided in the p well, and a low potential power supply potential (VSS) is applied to the p$^+$ diffusion region. On the other hand, in the case of the large driving buffer composed of PMOS transistor, an n$^+$ diffusion region is disposed so as to surround the outer circumference of this large driving buffer. The n$^+$ diffusion region is provided in the n well, and a high potential power supply potential (VDD) is applied to the n$^+$ diffusion region.

FIG. 1A is a plan view showing a structure of a conventional semiconductor integrated circuit, and FIG. 1B is an enlarged plan view showing a part of a guard ring section 32 in FIG. 1A. As shown in FIG. 1A, in this semiconductor integrated circuit, a hard macro 31 is provided on a semiconductor substrate 30, and the guard ring section 32 is formed on the outer circumference of the hard macro 31 so as to surround the hard macro 31. The guard ring section 32 is intended to protect the hard macro 31 from noise.

The guard ring section 32 consists of double guard rings, and as shown in FIG. 1B, in an inside guard ring, an n well 33 is disposed in the surface layer of the semiconductor substrate 30, and an n$^+$ diffusion region 34 is formed in the surface layer of the n well 33, while a VDD wiring 35 is provided on the n$^+$ diffusion region 34. Further, between the n$^+$ diffusion region 34 and VDD wiring 35, there are plural junctions 39a for connecting the n$^+$ diffusion region 34 to the VDD wiring 35. In an outside guard ring, on the other hand, a p well 36 is formed in the surface layer of the semiconductor substrate 30, and a p$^+$ diffusion region 37 is formed in the surface layer of the p well 36, while a VSS wiring 38 is provided on the p$^+$ diffusion region 37, and moreover, between the p$^+$ diffusion region 37 and VSS wiring 38, there are plural junctions 39b for connecting the p$^+$ diffusion region 37 to the VSS wiring 38.

In these guard rings, each diffusion region absorbs noise, so that the macro cell such as hard macro or large driving buffer can be protected from the noise propagating in the well.

Furthermore, Japanese Patent Application Laid-open No. 62(1987)-73760 (hereinafter called cited reference 1) discloses an art of increasing the sink current by the guard ring. FIG. 2 is FIG. 3 given in cited reference 1, being a sectional view showing the operation of the carrier around the guard ring in the semiconductor integrated circuit in an embodiment in cited reference 1. In this semiconductor integrated circuit, an n well 46 is formed in the surface layer of a p type substrate 45, and a source-drain 41 of a p type FET (field effect transistor) is provided in the surface layer of the n well 46, while a p$^+$ diffusion region 42 and an n$^+$ diffusion region 43 are formed so as to contact with each other in the sequence closer to the source-drain 41, and further these diffusion regions are connected by a metal element 44. The p$^+$ diffusion region 42 and n$^+$ diffusion region 43 are formed so as to surround the outer circumference of the p type FET, and the metal element 44 is connected to the VDD power source (not shown). A guard ring 51 is composed of the p$^+$ diffusion region 42, n$^+$ diffusion region 43, and metal element 44.

FIG. 2 is a schematic diagram of behavior of carrier near the guard ring 51 when the guard ring 51 is in a completely floating state. Noise is applied to the source-drain 41. At this time, a current 47 is a parasitic bipolar collect current using the p type substrate 45 as the collector, a current 49 is a parasitic bipolar collect current using the p$^+$ diffusion region 42 as the collector, and a current 48 is a base current accompanying the current 47 and the current 49. The current 49 passes into the p$^+$ diffusion region 42 from the source-drain 41 with the holes as the carriers. A current 50 passes into the n$^+$ diffusion region 43 with the electrons as the carriers. The holes, which are the carriers of the current 49, are re-coupled with the electrons, which are the carriers of the current 50, at the junction of the p$^+$ diffusion region 42 and n$^+$ diffusion region 43 and at the metal element 44. At this time, if the guard ring 51 is in floating state, by the current flowing in the p$^+$ diffusion region 42, the metal element 44, the n$^+$ diffusion region 43, and the n well 46, the potential of the p$^+$ diffusion region 42 is almost kept at VDD, and the current 49 hardly decreases. Accordingly, it is effective to prevent change of potential of the p type substrate 45 due to the noise current applied to the source-drain 41 flowing into the p type substrate 45.

However, in the conventional guard ring, as mentioned above, although the noise propagating in the well can be shielded, the noise propagating through the power source wiring cannot be shielded. Recently, in the trend of higher integration and higher performance of semiconductor integrated circuits, the peak current is increasing, and the noise in the power source wiring tends to increase.

SUMMARY OF THE INVENTION

It is an object of the present invention to provide a semiconductor integrated circuit having a guard ring capable of effectively shielding the noise from the surrounding circuits and power source noise, and preventing malfunctions of the macro cell due to noise, without substantially changing the layout of the macro cell.

A semiconductor integrated circuit of the present invention comprises a macro cell formed on a semiconductor substrate, and a guard ring provided to surround the circumference of the macro cell. The guard ring comprises an n well disposed so as to surround the macro cell, a p well disposed adjacent to said n well so as to surround the macro cell, a first n$^+$ diffusion region disposed in the surface layer of the n well to surround the macro cell in which a first potential is applied, a second n$^+$ diffusion region disposed in the surface layer of the p well to surround the macro cell in which the first potential is applied, a first p$^+$ diffusion region disposed in the surface layer of the n well to surround the macro cell in which a second potential lower than the first potential is applied, and a second p$^+$ diffusion region disposed in the surface layer of the p well to surround the macro cell in which the second potential is applied.

In the present invention, to achieve the object, diffusion capacitors are added to the guard rings disposed to surround the macro cell, such as the hard macro and the buffer of a large power consumption, that is, the large driving buffer. In other words, capacitors are formed between the n well and the first p$^+$ diffusion region, and between the p well and the second n$^+$ diffusion region. Accordingly, in the semiconductor integrated circuit, the capacitors are disposed so as to surround the macro cell. As a result, from these capacitors, an electric charge is released or supplied, and the electric charge is supplemented for charging and discharging of the wiring and through-current to the inverter, and it is effective to suppress voltage drop of the surrounding power source wire and voltage rise of the grounding wire. Hence, these capacitors can absorb steep power source noise caused by sudden change of the power source current to change the power source noise to a moderate one of small peak value, so that malfunctions of the macro cell can be prevented.

A semiconductor integrated circuit according to other aspect of the present invention comprises a macro cell formed on a semiconductor substrate, and a guard ring provided to surround the circumference of the macro cell. The guard ring comprises an n well disposed so as to surround the macro cell, a p well disposed adjacent to said n well so as to surround the macro cell, a first n$^+$ diffusion region disposed in the surface layer of the n well to surround the macro cell in which a first potential is applied, a second n$^+$ diffusion region disposed in the surface layer of the p well to surround the macro cell in which the first potential is applied, and a first p$^+$ diffusion region disposed in the surface layer of the p well to surround the macro cell in which a second potential lower than the first potential is applied.

Therefore, a capacitor can be formed between the p well and the second n$^+$ diffusion region, and the power source noise is absorbed by the capacitor, thereby preventing malfunctions of the macro cell.

A semiconductor integrated circuit according to another aspect of the present invention comprises a macro cell formed on a semiconductor substrate, and a guard ring provided to surround the circumference of the macro cell. The guard ring comprises an n well disposed so as to surround the macro cell, a p well disposed adjacent to said n well so as to surround the macro cell, a first n$^+$ diffusion region disposed in the surface layer of the n well to surround the macro cell in which a first potential is applied, a first p$^+$ diffusion region disposed in the surface layer of the n well to surround the macro cell in which a second potential lower than the first potential is applied, and a second p$^+$ diffusion region disposed in the surface layer of the p well to surround the macro cell in which the second potential is applied.

Therefore, a capacitor can be formed between the n well and the first p$^+$ diffusion region, and the power source noise is absorbed by the capacitor, thereby preventing malfunctions of the macro cell.

In the semiconductor integrated circuit, a first wiring may be connected to both of the first and second n$^+$ diffusion regions to apply the first potential to the first and second n$^+$ diffusion regions, and the first and second n$^+$ diffusion regions may be disposed beneath the first wiring and parallel to the first wiring.

As a result, the layout size of the guard ring can be reduced, and the change from the layout of the conventional guard ring may be kept to a minimum limit.

As the macro cell, the hard macro or buffer can be used.

DETAILED DESCRIPTION OF THE PREFERRED EMBODIMENTS

Referring now to the accompanying drawings, preferred embodiments of the present invention are described in detail below.

Figure 1A:
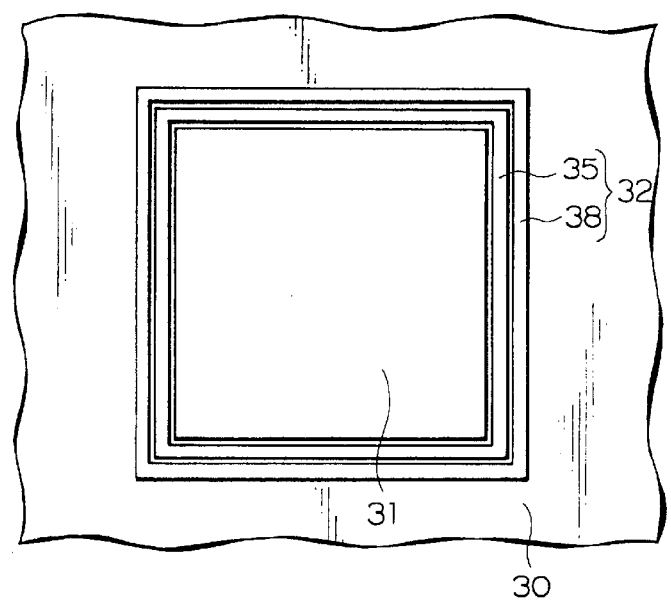
FIG. 1A is a plan view showing a structure of a conventional semiconductor integrated circuit.
Figure 1B:
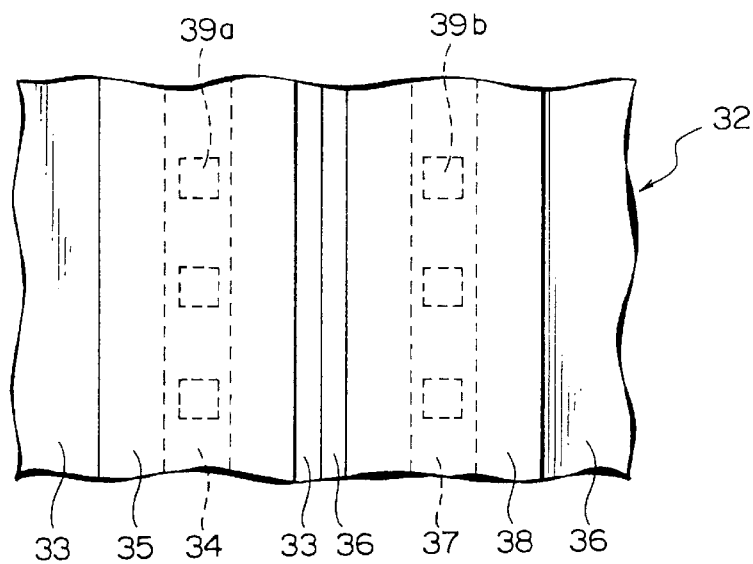
FIG. 1B is an enlarged plan view showing a part of a guard ring section 32 shown in FIG. 1A.
Figure 2:
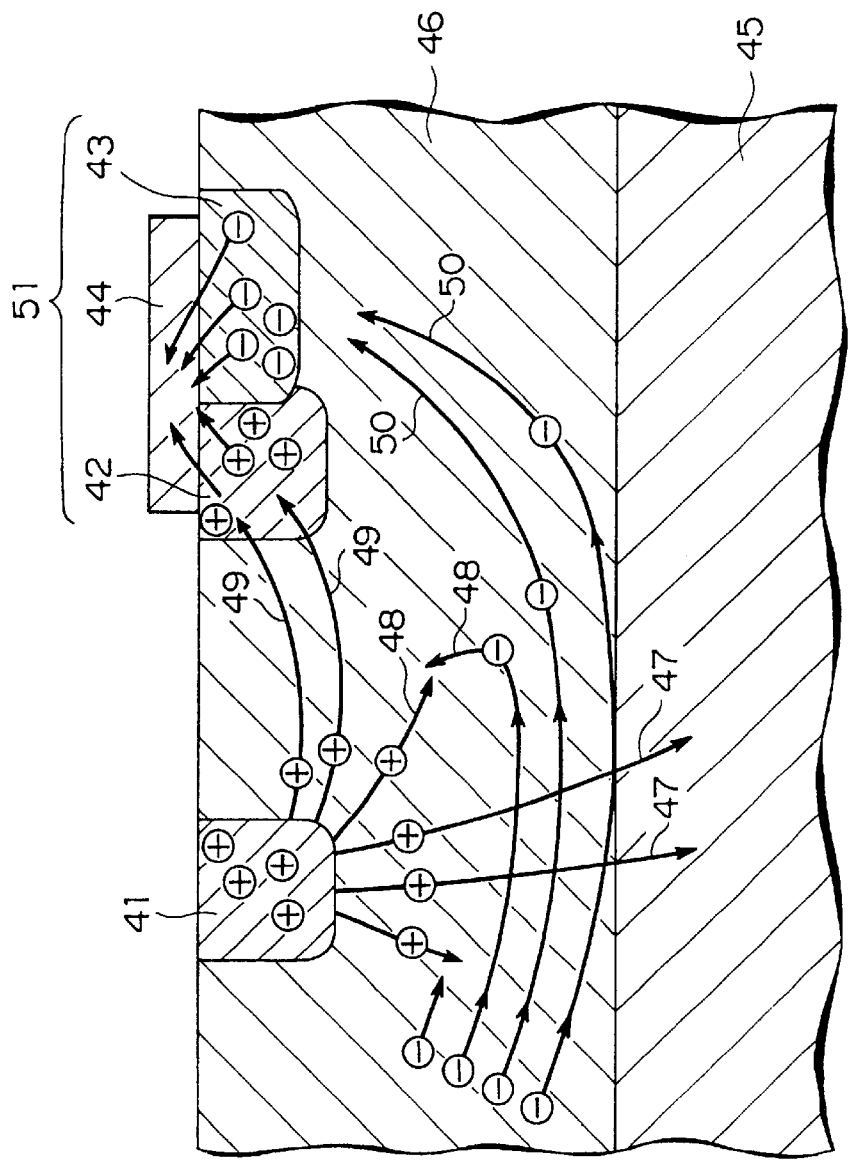
FIG. 2 is a sectional view showing operation of a conventional semiconductor integrated circuit.
Figure 3A:
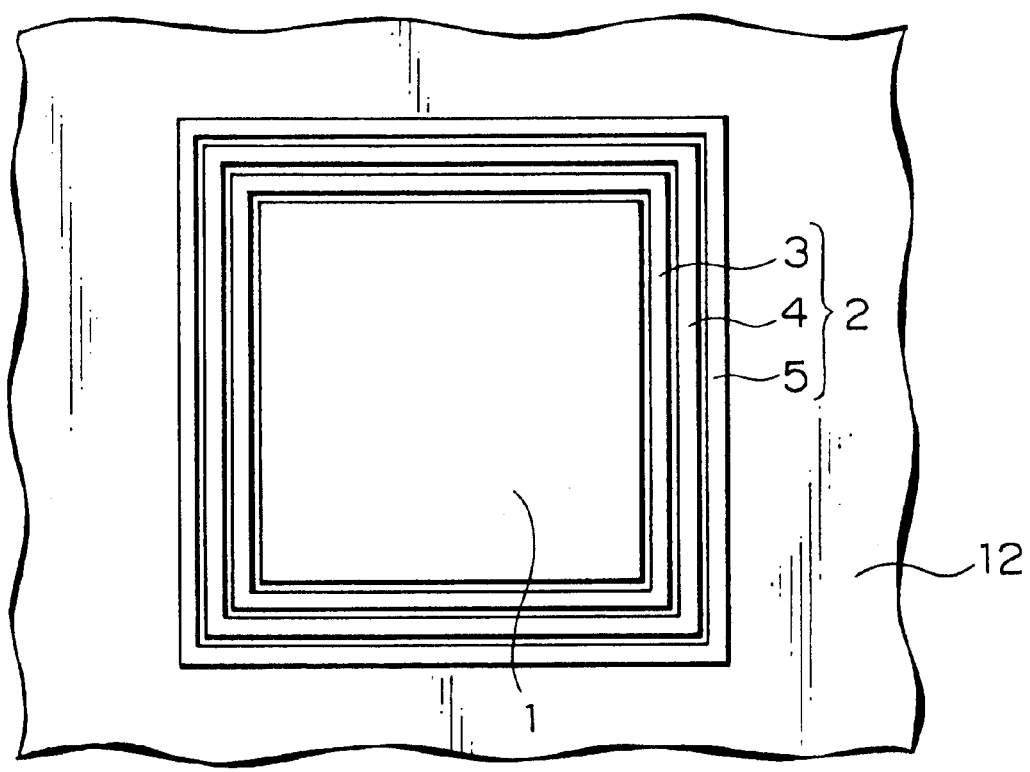
FIG. 3A is a plan view showing a structure of a semiconductor integrated circuit in a first embodiment of the present invention.

A first embodiment of the invention is explained. FIG. 3A is a plan view showing a structure of a semiconductor integrated circuit of the embodiment, FIG. 3B is an enlarged plan view showing a part of a guard ring 2 in the semiconductor integrated circuit shown in FIG. 3A, and FIG. 3C is a sectional view along line A—A in FIG. 3B.

As shown in FIG. 3A, in the semiconductor integrated circuit of the embodiment, a hard macro 1 is formed on a semiconductor substrate 12, and the guard ring section 2 is disposed around the hard macro 1 to surround the circumference of the hard macro 1. The guard ring section 2 has three independent wirings, and each wiring is disposed in a rectangular form to surround the hard macro 1. These wirings are VSS wiring 3, VDD wiring 4, and VSS wiring 5 sequentially from the inside. The VSS wiring 3, the VDD wiring 4, and the VSS wiring 5 are formed on a same plane, and arranged parallel to each other at the sides of the rectangular form. A potential VSS is applied to the VSS wirings 3 and 5, and a potential VDD is applied to the VDD wiring 4.

Figure 3B:
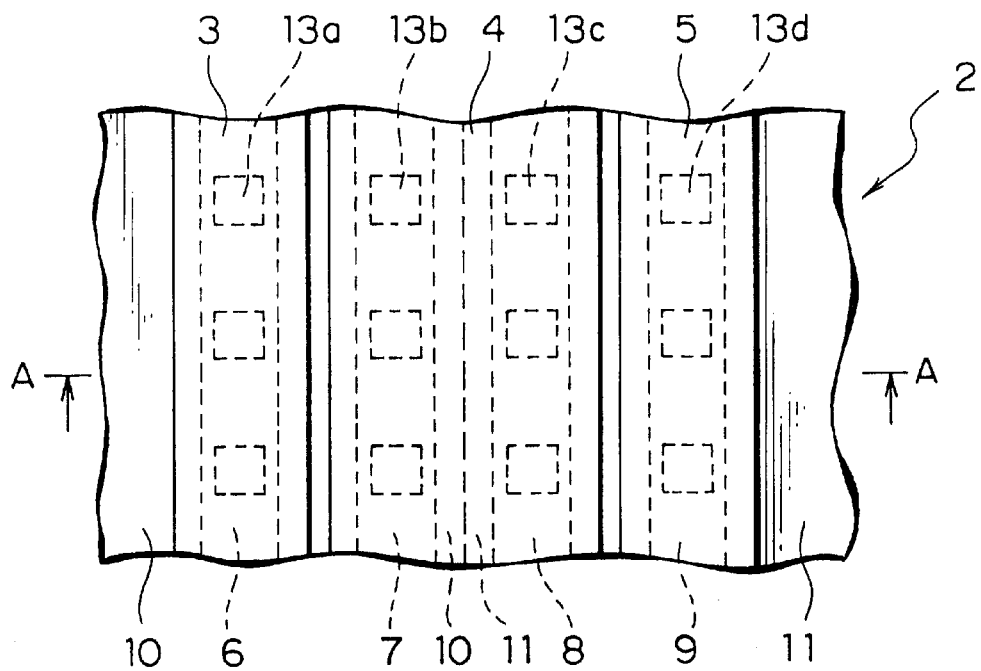
FIG. 3B is an enlarged plan view showing a part of a guard ring section 2 shown in FIG. 3A.
Figure 3C:
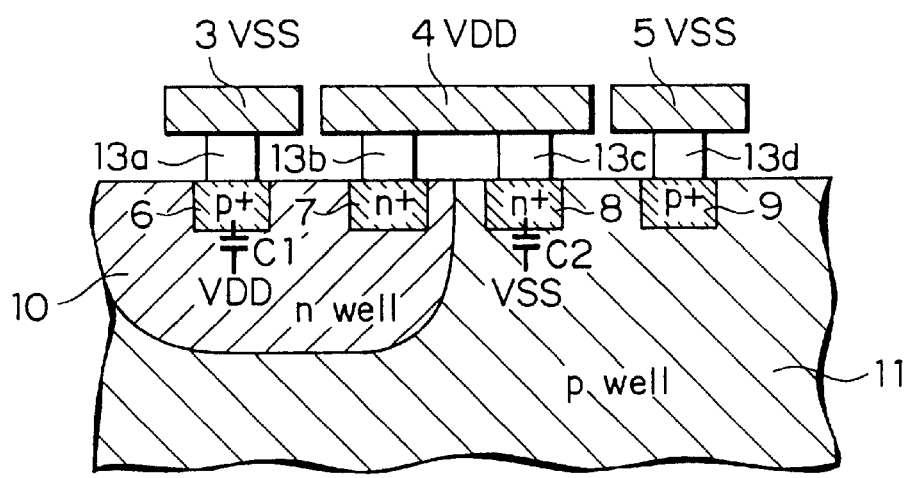
FIG. 3C is a sectional view along line A—A in the guard ring section shown in FIG. 3B.

As shown in FIG. 3B and FIG. 3C, a plurality of junctions 13a are provided beneath the VSS wiring 3 in a row along the VSS wiring 3, and connected to the VSS wiring 3. A plurality of junctions 13b and 13c are provided beneath the VDD wiring 4 each in a row along the VDD wiring 4, and connected to the VDD wiring 4. The row of the junctions 13b and the row of the junctions 13c are parallel to each other. Further, a plurality of junctions 13d are provided beneath the VSS wiring 5 in a row along the VSS wiring 5, and connected to the VSS wiring 5.

Beneath the junctions 13a, a p$^+$ diffusion region 6 is provided, and the VSS wiring 3 is connected to the p$^+$ diffusion region 6 through the junctions 13a. Beneath the junctions 13b, an n$^+$ diffusion region 7 is provided, and beneath the junctions 13c, an n$^+$ diffusion region 8 is provided, and the VDD wiring 4 is connected to the n$^+$ diffusion region 7 through the junctions 13b, and is also connected to the n+ diffusion region 8 through the junctions 13c. Also beneath the junctions 13d, a p+ diffusion region 9 is provided, and the VSS wiring 5 is connected to the p+ diffusion region 9 through the junctions 13d.

Of these diffusion regions, the outside two regions, that is, the n+ diffusion region 8 and p+ diffusion region 9 are provided in the surface layer of a p well 11 formed in the surface layer of the semiconductor substrate 12, and the inside two regions, that is, the p+ diffusion region 6 and n+ diffusion region 7 are provided in the surface layer of an n well 10 formed in a part of the surface layer of the p well 11. In other words, these diffusion regions are arranged so that the boundary of the n well 10 and the p well 11 may be located between the n+ diffusion region 7 and the n+ diffusion region 8.

In such layout, the potential of the n well 10 is set at VDD by the n+ diffusion region 7, while the potential of the p+ diffusion region 6 formed in the n well 10 is VSS and no current flows between the n well 10 and p+ diffusion region 6, and therefore a capacitor C1 is formed between the n well 10 and p+ diffusion region 6. Similarly, the potential of the p well 11 is set at VSS by the p+ diffusion region 9, while the potential of the n+ diffusion region 8 formed in the p well 11 is VDD and no current flows between the p well 11 and n+ diffusion region 8, and therefore a capacitor C2 is formed between the p well 11 and n+ diffusion region 8.

The operation of the semiconductor integrated circuit of the embodiment is described below. In the hard macro 1 and the circuit sharing the power source with the hard macro 1, if a sudden current change occurs, such as charting or discharging in the wiring due to switching of transistor or occurrence of through-current into the inverter, the potential of the VDD wiring and the potential of the VSS wiring may be raised or lowered due to resistance and inductance of the VDD wiring and VSS wiring. This voltage fluctuation becomes a power source noise, which causes to increase delay or the like, and if the effect is excessive, a malfunction of the semiconductor integrated circuit may be induced. To decrease such power source noise, it is effective to add a capacitor to the power source wiring. It is because the capacitor covers a part of charge or discharge of the electric charge necessary for current change, and the electric charge for charging or discharging in the wiring and through-current into the inverter is supplemented, thereby suppressing voltage drop of the surrounding power source wires and voltage rise of the grounding wire. In the embodiment, this role is played by the capacitors C1 and C2 provided around the hard macro 1. As a result, if a power source noise due to sudden current change occurs, its peak value is decreased, so that the change may be moderate. Moreover, the guard ring section 2 also acts to absorb the noise propagating in the well, same as the guard ring in the conventional semiconductor integrated circuit.

Thus, the semiconductor integrated circuit of the embodiment absorbs the noise propagating in the well, and also absorbs the noise propagating in the power source wiring, so that malfunctions of the hard macro 1 may be prevented.

Only by changing the layout of the guard ring section of the conventional semiconductor integrated circuit, the semiconductor integrated circuit of the embodiment is formed, and it is effective to suppress the effects on the layout size of the hard macro and large-scale buffer.

As easily estimated, in the embodiment, if the n well 10 and p well 11 are exchanged, the p+ diffusion region of potential VSS can be formed in the n well, and the n+ diffusion region of potential VDD can be formed in the p well, and the same effects as in the embodiment can be obtained. Similarly, the p+ diffusion region 6 and n+ diffusion region 7 may be exchanged, and the n+ diffusion region 8 and p+ diffusion region 9 may be exchanged. In this case, however, a potential VDD is applied in the n+ diffusion region, and a potential VSS is applied in the p+ diffusion region.

Figure 4A:
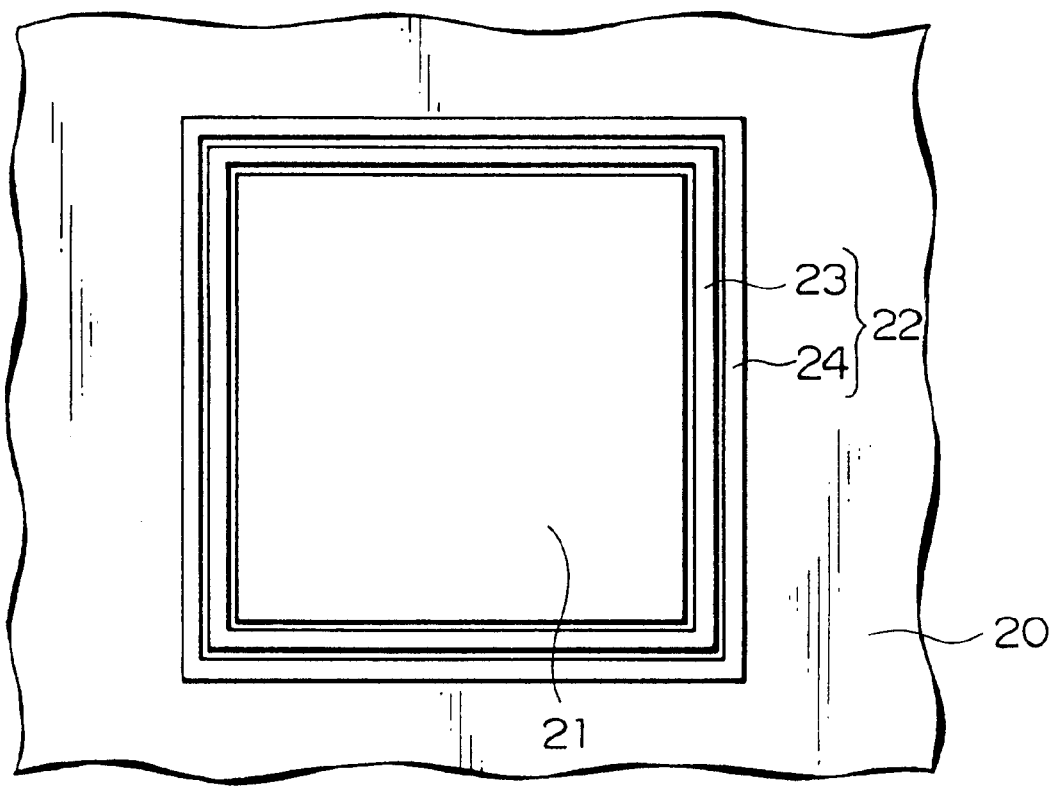
FIG. 4A is a plan view showing a structure of a semiconductor integrated circuit in a second embodiment of the present invention.

A second embodiment of the present invention is explained. FIG. 4A is a plan view showing a structure of a semiconductor integrated circuit of the embodiment, FIG. 4B is an enlarged plan view showing a part of a guard ring section 22 in the semiconductor integrated circuit shown in FIG. 4A, and FIG. 4C is a sectional view along line A—A in FIG. 4B.

The feature of the semiconductor integrated circuit of the embodiment is, as compared with the first embodiment, that the VSS wiring and p+ diffusion region at the n well side are not provided in the guard ring section 22.

As shown in FIG. 4A, in the semiconductor integrated circuit of the embodiment, a hard macro 21 is formed on a semiconductor substrate 20, and the guard ring section 22 is disposed to surround the hard macro 21. In the guard ring section 22, VDD wiring 23 and VSS wiring 24 are formed on a same plane, and each wiring is formed in a rectangular form to surround the hard macro 21. The VDD wiring 23 is disposed at the inner side of the VSS wiring 24, that is, at the side closer to the hard macro 21. A potential VDD is applied to the VDD wiring 23, and a potential VSS is applied to the VSS wiring 24.

Figure 4B:
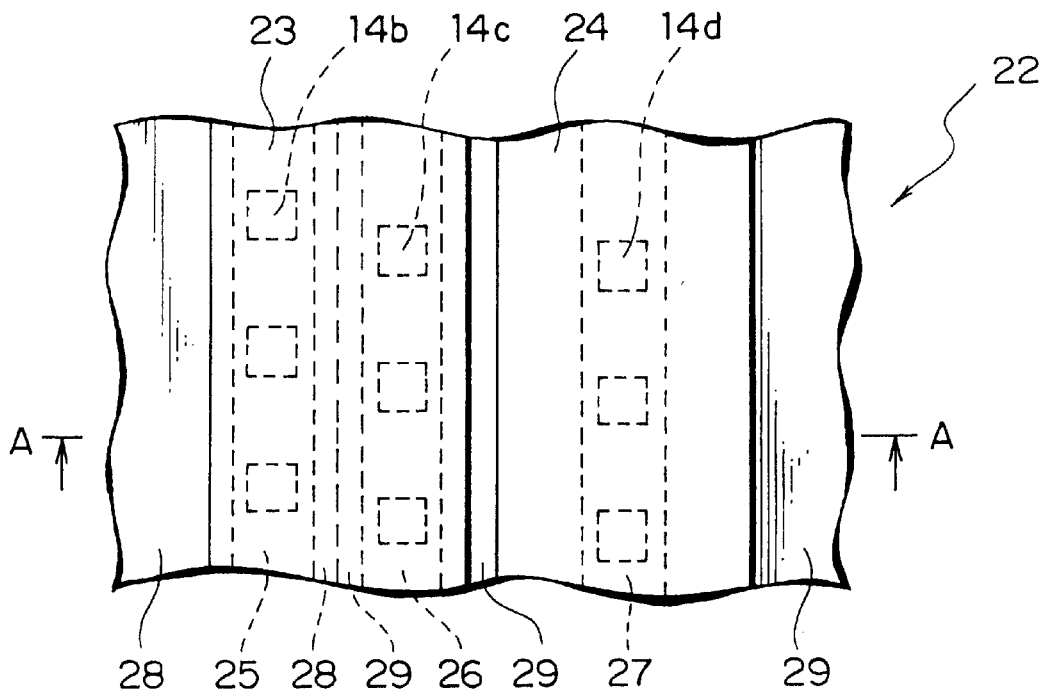
FIG. 4B is an enlarged plan view showing a part of a guard ring section 22 shown in FIG. 4A.
Figure 4C:
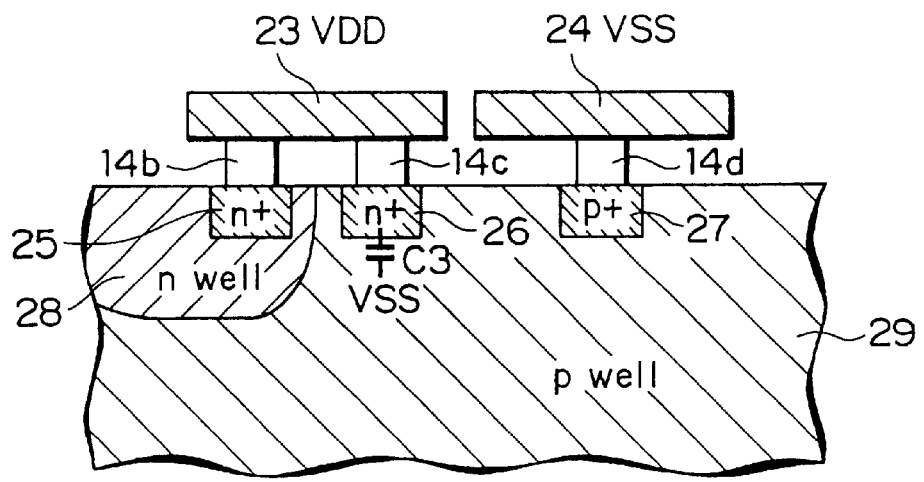
FIG. 4C is a sectional view along line A—A in the guard ring section shown in FIG. 4B.

As shown in FIG. 4B and FIG. 4C, a plurality of junctions 14b and 14c are provided beneath the VDD wiring 23 each in a row along the VDD wiring 23, and connected to the VDD wiring 23. The row of the junctions 14b and the row of the junctions 14c are parallel to each other, and the row of the junctions 14b is disposed at the inner side of the row of the junctions 14c. Further, a plurality of junctions 14d are provided beneath the VSS wiring 24 in a row along the VSS wiring 24, and connected to the VSS wiring 24.

Beneath the junctions 14b, an n+ diffusion region 25 is provided, and beneath the junctions 14c, an n+ diffusion region 26 is provided, and the VDD wiring 23 is connected to the n+ diffusion region 25 through the junctions 14b, and is also connected to the n+ diffusion region 26 through the junctions 14c. Also beneath the junctions 14d, a p+ diffusion region 27 is provided, and the VSS wiring 24 is connected to the p+ diffusion region 27 through the junctions 14d.

Of these three diffusion regions surrounding the hard macro 21, the innermost n+ diffusion region 25 is provided in the surface layer of an n well 28 formed in the surface layer of the semiconductor substrate 20, and the middle n+ diffusion region 26 and the outermost p+ diffusion region 27 are provided in the surface layer of a p well 29 formed in the surface layer of the semiconductor substrate 20. In other words, these diffusion regions are arranged so that the boundary of the n well 28 and the p well 29 may be located between the n+ diffusion region 25 and the n+ diffusion region 26.

Accordingly, the potential of the n well 28 is set at VDD by the n+ diffusion region 25. The potential of the p well 29 is set at VSS by the p+ diffusion region 27, and the potential of the n+ diffusion region 26 formed in the p well 29 is VDD. Since no current flows between the p well 29 and n+ diffusion region 26, a capacitor C3 is formed between the p well 29 and n+ diffusion region 26.

In the first embodiment, the VSS wiring 3 and p+ diffusion region 6 are provided, and the capacitor C1 is formed, but this embodiment omits the p+ diffusion region corresponding to the p+ diffusion region 6 and the wiring corresponding to the VSS wiring 3 in the first embodiment. Hence, as shown in FIG. 4C, in the semiconductor integrated circuit of the embodiment, there is no capacitor corresponding to the capacitor C1 in the first embodiment, and only the capacitor C3 corresponding to the capacitor C2 in the first embodiment is formed.

By this capacitor C3, the power source noise in the VDD wiring 23 is absorbed, and malfunctions of the hard macro 21 due to power source noise can be prevented. The guard ring 22, like the guard ring in the conventional semiconductor integrated circuit, can absorb the noise propagating in the well.

In the semiconductor integrated circuit of this embodiment, as compared with the semiconductor integrated circuit of the first embodiment, the structure of the guard ring section 22 can be simplified.

In the first and second embodiments, as the macro cell, the hard macro is used, but the large scale buffer may be also used as the macro cell in the present invention, or other types of macro cell may be also used.

The embodiments of the present invention described above, the present invention is not limited to the illustrated embodiments alone, and various changes and modifications are possible within the scope of the ordinary knowledge of those techniques in the art.

What is claimed is:

1. A semiconductor integrated circuit comprising:
   a macro cell formed on a semiconductor substrate, and
   a guard ring provided to surround the circumference of said macro cell, said guard ring comprising:
   an n well disposed so as to surround the macro cell,
   a p well disposed adjacent to said n well to surround the macro cell,
   a first n+ diffusion region disposed in the surface layer of the n well to surround the macro cell in which a first potential is applied,
   a second n+ diffusion region disposed in the surface layer of the p well to surround the macro cell in which the first potential is applied,
   a first p+ diffusion region disposed in the surface layer of the n well to surround the macro cell in which a second potential lower than the first potential is applied, and
   a second p+ diffusion region disposed in the surface layer of the p well to surround the macro cell in which the second potential is applied.

2. The semiconductor integrated circuit according to claim 1, further comprising:
   a first wiring connected to both of said first and second n+ diffusion regions to apply the first potential to said first and second n+ diffusion regions,
   wherein said first and second n+ diffusion regions are disposed beneath the first wiring and parallel to the first wiring.

3. The semiconductor integrated circuit according to claim 1, further comprising:
   a second wiring connected to said first p+ diffusion region to apply the second potential to said first p+ diffusion region, and
   a third wiring connected to both of said second wiring and said second p+ diffusion region to apply the second potential to said second p+ diffusion region,
   wherein said first and second p+ diffusion regions are disposed beneath the second and third wirings respectively and parallel to the second and third wirings.

4. The semiconductor integrated circuit according to claim 1, further comprising:
   a first wiring connected to both of said first and second p+ diffusion regions to apply the second potential to said first and second p+ diffusion regions,
   wherein said first and second p+ diffusion regions are disposed beneath the first wiring and parallel to the first wiring.

5. The semiconductor integrated circuit according to claim 1, further comprising:
   a second wiring connected to said first n+ diffusion region to apply the first potential to said first n+ diffusion region, and
   a third wiring connected to both of said second wiring and said second n+ diffusion region to apply the first potential to said second n+ diffusion region,
   wherein said first and second n+ diffusion regions are disposed beneath the second and third wirings respectively and parallel to the second and third wirings.

6. The semiconductor integrated circuit according to claim 1, wherein said macro cell is a hard macro.

7. The semiconductor integrated circuit according to claim 1, wherein said macro cell is a buffer.

8. A semiconductor integrated circuit comprising:
   a macro cell formed on a semiconductor substrate, and
   a guard ring provided to surround the circumference of said macro cell, said guard ring comprising:
   an n well disposed so as to surround the macro cell,
   a p well disposed adjacent to said n well to surround the macro cell,
   a first n+ diffusion region disposed in the surface layer of the n well to surround the macro cell in which a first potential is applied,
   a second n+ diffusion region disposed in the surface layer of the p well to surround the macro cell in which the first potential is applied, and
   a first p+ diffusion region disposed in the surface layer of the p well to surround the macro cell in which a second potential lower than the first potential is applied.

9. The semiconductor integrated circuit according to claim 8, further comprising:
   a first wiring connected to both of said first and second n+ diffusion regions to apply the first potential to said first and second n+ diffusion regions,
   wherein said first and second n+ diffusion regions are disposed beneath the first wiring and parallel to the first wiring.

10. A semiconductor integrated circuit comprising:
    a macro cell formed on a semiconductor substrate, and
    a guard ring provided to surround the circumference of said macro cell, said guard ring comprising:
    an n well disposed so as to surround the macro cell,
    a p well disposed adjacent to said n well to surround the macro cell,
    a first n+ diffusion region disposed in the surface layer of the n well to surround the macro cell in which a first potential is applied,
    a first p+ diffusion region disposed in the surface layer of the n well to surround the macro cell in which a second potential lower than the first potential is applied, and
    a second p+ diffusion region disposed in the surface layer of the p well to surround the macro cell in which the second potential is applied.

* * * * *